United States Patent [19]
Aoki et al.

[11] Patent Number: 5,507,898
[45] Date of Patent: Apr. 16, 1996

[54] METHOD OF MAKING A MULTILAYER PIEZOELECTRIC COMPOSITE

[75] Inventors: Masashi Aoki; Kiyoshi Fukai; Kazunobu Abe, all of Osaka; Koichiro Sakata, Nagareyama; Tadashi Takenaka, Kashiwa, all of Japan

[73] Assignee: Sakai Chemical Industry Co., Ltd., Osaka, Japan

[21] Appl. No.: 313,924

[22] Filed: Sep. 26, 1994

Related U.S. Application Data

[62] Division of Ser. No. 194,747, Feb. 10, 1994, abandoned, which is a continuation of Ser. No. 61,503, May 14, 1993, abandoned, which is a continuation of Ser. No. 608,473, Nov. 2, 1990, abandoned.

[30] Foreign Application Priority Data

Nov. 2, 1989 [JP] Japan .................. 1-286624

[51] Int. Cl.$^6$ .................. B32B 31/04; B32B 31/20
[52] U.S. Cl. .................. 156/89; 264/61; 310/358; 310/359; 501/134
[58] Field of Search .................. 252/62.9; 310/358, 310/359; 156/89; 264/56, 58, 61; 501/134

[56] References Cited

U.S. PATENT DOCUMENTS

| | | | |
|---|---|---|---|
| 3,179,594 | 4/1965 | Kulesar et al. | 252/62.9 |
| 3,661,781 | 2/1970 | Ichinose et al. | 252/62.9 |
| 3,963,630 | 6/1976 | Yonezawa et al. | 501/134 |
| 4,131,444 | 12/1978 | Walker et al. | 501/134 |
| 4,570,098 | 2/1986 | Tomita et al. | 310/346 |
| 4,885,498 | 12/1989 | Wakita | 310/359 X |
| 5,032,471 | 7/1991 | Sakata et al. | 428/699 |
| 5,096,642 | 3/1992 | Shirasaki | 501/134 X |

OTHER PUBLICATIONS

Wersing, "Ferroelectrics", vol. 37, pp. 611–614.

*Primary Examiner*—David A. Simmons
*Assistant Examiner*—M. Curtis Mayes
*Attorney, Agent, or Firm*—Merchant, Gould, Smith, Edell, Welter & Schmidt

[57] ABSTRACT

A multilayer piezoelectric composite comprising a bonded laminate each layer of which is composed of a green sheet of a low-temperature sintering lead zirconate titanate piezoelectric ceramic. The temperature coefficient of a frequency constant of at least one layer has a polarity opposite to the polarity of those of the other layers. The bonded laminate is sintered at a temperature which does not produce any or almost any interdiffusion between layers so that the absolute value of the temperature coefficient of a frequency constant of the bonded laminate is smaller than the absolute value of the temperature coefficient of a frequency constant of any or one of the layers.

1 Claim, 4 Drawing Sheets

FIG. 2

| PZT 52 |
|--------|
| PZT 54 |
| PZT 52 |
| PZT 54 |

FIG. 3

| PZT 52 |
|--------|
| PZT 55 |
| PZT 55 |
| PZT 52 |
| PZT 55 |
| PZT 55 |

FIG. 4

| PZT 52 |
|--------|
| PZT 55 |
| PZT 55 |
| PZT 55 |
| PZT 52 |
| PZT 55 |
| PZT 55 |
| PZT 55 |

FIG. 5

| PZT 52 |
|--------|
| PZT 55 |
| PZT 55 |
| PZT 55 |
| PZT 55 |

METHOD OF MAKING A MULTILAYER PIEZOELECTRIC COMPOSITE

This application is a division of Ser. No. 08/194,747 filed Feb. 10, 1994; which is a continuation of application Ser. No. 08/061,503 filed May 14, 1993; which is a continuation of application Ser. No. 07/608,473 filed Nov. 2, 1990, all of which are abandoned.

BACKGROUND OF THE INVENTION

1. Field of the Invention

The present invention relates to a multilayer piezoelectric composite and, more particularly, to a multilayer piezoelectric composite which is suitable for uses as a whole in which the temperature dependence of the piezoelectric characteristics required to be low, especially, as an electronic circuit element such as a resonance filter and a wave filter.

2. Description of the Prior Art

Piezoelectric materials which enable the mutual conversion between electric energy (electric field) and mechanical energy (strain) are not only utilized for a capacitor and the like as a ferroelectric material but also used as a piezoelectric vibrator for an ultrasonic washer, tuning fork filter, ultrasonic wave oscillator, piezoelectric coupler and ceramic filter, piezoelectric igniting element, piezoelectric element for a transformer, a delaying element, etc., in other words, they are used as a kind of functional materials.

Such piezoelectric materials are classified into three types by their forms, namely, a piezoelectric single crystal, a piezoelectric thin film and a piezoelectric ceramic.

Among these, it is a lead zirconate titanate $PbZrO_3$-$PbTiO_3$ (hereinunder referred to as "PZT") piezoelectric ceramic, which is a two-component solid solution of a ferroelectric material, zirconate and an antiferroelectric material, titanate that is most widely used.

It is known that in the case of a PZT piezoelectric ceramic, when the molar ratio of zirconium and titanium (hereinunder referred to as "Z/T") is 53/47, a morphotropic phase transition from a rhombohedral phase to a tetragonal phase is caused and that piezoelectric constant and an electromechanical coupling factor remarkably increase in the vicinity of the morphotropic phase boundary.

However, in PZT piezoelectric ceramic having a composition approximate to the morphotropic phase boundary, the temperature dependence of the piezoelectric characteristic is high.

FIG. 7 is a graph showing the temperature dependence of frequency constants Np (unit: Hz·m) of PZT. The numeral in a parenthesis represents a temperature coefficient (TCNp) of a frequency constant Np in a constant temperature range. The temperature coefficient in this specification means the value (unit: ppm) obtained by dividing the difference between the maximum value $Np_{MAX}$ and the minimum value $Mp_{MIN}$ of the frequency constant Np in the temperature range of 20° to 100° C. by the temperature difference $\Delta T$ and and further dividing the quotient by the frequency constant $Np_{30}$ at a temperature 30° C. unless specified otherwise. With respect to PZT, however, since it is curved in a concave, the quotient is divided by $Np_{20}$ and $N_{70}$ and the temperature coefficients both in the positive direction and in the negative direction are shown.

Additionally, the reason why the temperature range is restricted to below 100° C. is that this range is considered to be a generally practical temperature range for a PZT piezoelectric ceramic. The PZT 52 to the PZT 55 In FIG. 7 represent a single-layer PZT piezoelectric ceramics and the each numeral is equal to the value x in the general formula $PbZr_xTi_{1-x}$ representing a PZT piezoelectric ceramic which are multiplied by 100. For example, $100_x=53$ represents a PZT piezoelectric ceramic represented by the formula $PbZr_{0.53}Ti_{0.47}O_3$ (hereinunder referred to as "PZT 53").

As shown in the parentheses in the graph, the temperature coefficients of the conventional single-layer PZT piezoelectric ceramics are in the order of three figures (PZT 55: $-160\times10^{-6}$, PZT 54: $-440\times10^{-6}$, PZT 53: $-345\times10^{-6}$, $+345\times10^{-6}$, PZT 52: $-460\times10^{-6}$).

Such a piezoelectric ceramic the piezoelectric characteristic of which greatly depends on the temperature is not generally suitable for the use as an electronic circuit element such as a resonance filter and a wave filter.

As a result of studies undertaken by the present inventors so as to solve this problem, it has been found that it is easy to obtain a piezoelectric ceramic having a low temperature dependence without the need for introducing a third component by laminating not less than two piezoelectric ceramics at least one of which has a temperature coefficient having a polarity opposite to the polarity of those of the other layers and which can be sintered at a temperature at which the ceramics form a solid solution, and sintering these ceramics at the comparatively low temperature which do not allow these ceramics to form a solid solution.

The present invention has been achieved on the basis of this finding.

SUMMARY OF THE INVENTION

Accordingly, it is an object of the present invention to produce a multilayer piezoelectric composite having a low temperature dependence and a process for producing the same.

To achieve this aim, a multilayer piezielectric composite according to the present invention comprises a bonded laminate each layer of which is composed of a green sheet of low-temperature sintering PZT piezoelectric ceramic, which can sinter without producing any or almost any interdiffusion between layers, and in which the temperature coefficient of a frequency constant of at least one layer has a polarity opposite to the polarity of those of the other layers, the bonded laminate being sintered at a temperature which does not produce any or almost any interdiffusion between layers so that the absolute value of the temperature coefficient of a frequency constant of the bonded laminate is smaller than the absolute value of the temperature coefficient of a frequency constant of any or one of the layers.

A process for producing a multilayer piezoelectric composite according to the present invention comprises the steps of laminating and bonding under a pressure green sheets of plural kinds of PZT piezoelectric ceramics in which the temperature coefficient of a frequency constant of at least one layer has a polarity opposite to the polarity of those of the other layers and which can sinter at a temperature which does not produce any or almost any interdiffusion between layers, and sintering the bonded laminate at the temperature which does not produce any or almost any interdiffusion between layers so that the absolute value of the temperature coefficient of a frequency constant of the bonded laminate is smaller than the absolute value of the temperature coefficient of a frequency constant of any or one of the layers.

The above and other objects, features and advantages of the present invention will become clear from the following description of the preferred embodiments thereof, taken in conjunction with the accompanying drawings.

BRIEF DESCRIPTION OF THE DRAWINGS

FIGS. 2 to 5 are schematic sectional views of embodiments of a multilayer piezoelectric composite according to the present invention;

DESCRIPTION OF THE PREFERRED EMBODIMENTS

It is necessary in a multilayer piezoelectric composite according to the present invention that the polarity of the temperature coefficient of a frequency constant of at least one layer of the bonded laminate is opposite to the polarity of those of the other layers. This is because the present invention aims at producing a piezoelectric element having a piezoelectric characteristic which has a low temperature dependence. The polarity of the temperature coefficient means a positive or negative polarity of the temperature coefficient of a frequency constant in a temperature range which is considered to be a practical range.

It is also necessary that each layer of the bonded laminate is composed of a green sheet of a low-temperature sintering PZT piezoelectric ceramic. If a high-temperature sintering PZT piezoelectric ceramic is used, it is impossible to obtain a bonded laminate having a low temperature dependence because the interdiffusion of ions is caused between layers during sintering the bonded laminate.

In the process for producing a green sheet of a PZT piezoelectric ceramic, it is necessary to use a fine PZT powder having an excellent low-temperature sintering property. As an example of such a PZT powder having an excellent low-temperature property, lead zirconate titanate having a particle size of not more than 0.5 μm will be cited which is obtained by heat treating crystalline zirconium titanate represented by the general formula $Zr_xTi_{1-x}O_2$ and having a particle diameter of not more than 0.3 μm and lead oxide at a temperature of not higher than 800° C., and pulverizing the reaction product as disclosed in Japanese Patent Application No. 64695/1989, which was filed by the present applicant.

Alternatively, it is possible to use a fine PZT powder obtained by an alkoxide method (sol-gel method), partial oxalic acid method, autoclaving method or fine material powder calcinating method.

If any of the PZT piezoelectric ceramics has a high sintering temperature, the laminate is forced to be sintered at a high temperature, inconveniently resulting in interdiffusion between layers.

This is the reason why each layer of the bonded laminate is composed of a green sheet of a low-temperature sintering PZT piezoelectric ceramic powder and the bonded laminate is sintered at a temperature which does not cause interdiffusion between layers.

Figure 1:
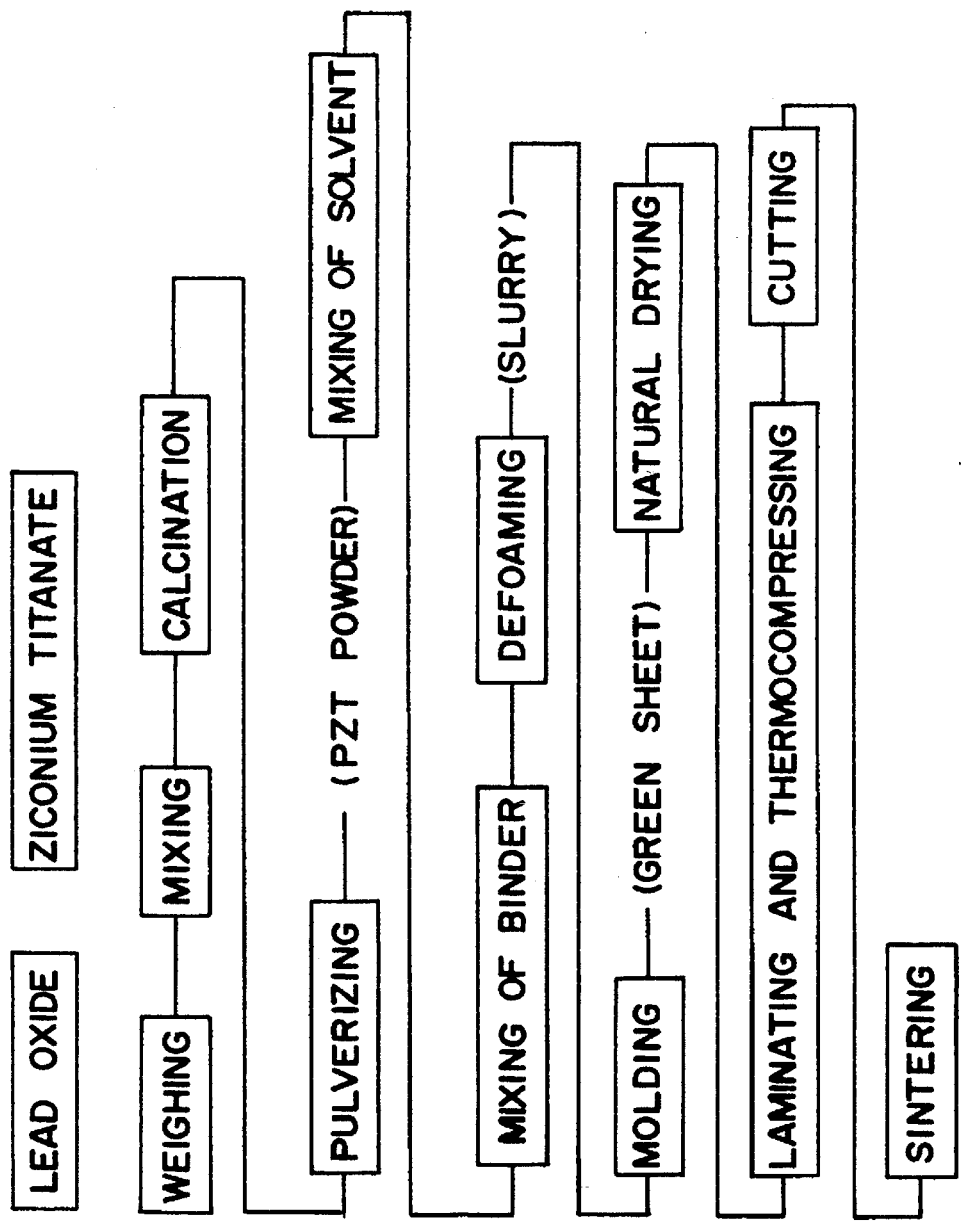
FIG. 1 is a flow sheet of a tape casting process.

A process for producing a multilayer piezielectric composite in accordance with the present invention will be explained hereinunder with reference to the flow sheet shown FIG. 1 while citing a tape casting process as an example.

Starting materials are first weighed so that each layer has a desired composition, and mixed together with acetone by a wet process in a ball mill containing zirconia balls for about 10 hours. Thereafter, the mixture is calcinated at a temperature of about 700° C. for about 1 hour.

The thus-obtained calcinated PZT powder is pulverized in a ball mill and a planetary mill into particles about 1 μm in diameter, and appropriate amounts of solvent and binder are added thereto followed by thorough agitation. The resulting mixture is defoamed under a reduced pressure to obtain a slurry.

The slurry obtained is molded into a green sheet of a piezoelectric ceramic powder of about 100 um thick by a tape casting process while using a doctor blade.

In the same way, plural kinds of green sheets which have different polarities and absolute values of the temperature coefficients are produced in an appropriate number for each in accordance with the composition of a composite piezoelectric element.

Finally, an appropriate number of sheets are selected for each kind of PZT piezoelectric ceramic having a different polarity so as to produce a multilayer piezoelectric composite having a temperature coefficient corresponding to the purpose of use, and these selected green sheets are laminated. After the thermocompression bonding of these laminated sheets at a temperature of about 80° C. under an applied pressure of about 300 kg/cm², the bonded laminate is sintered at a temperature of about 800° to 1,100° C., preferably no higher than 1,100° C.

Additionally, although the ordinary sintering temperature of a piezoelectric ceramic is considered to be not lower than 1,200° C. (*Ceramics Dielectric Engineering* by Kiyoshi Okazaki, p. 347, published by Gakken-sha (1983)), it is impossible to prevent the unification between layers at such a high sintering temperature.

For example, in the case of a bonded laminate obtained by laminating green sheets having a plurality of compositions in the above-described manner which are obtained by thoroughly mixing 2 mol of commercially available titanium oxide (A-110, reference code; produced by Sakai Chemical Industry Co., Ltd.) and 2 mol of lead oxide (Special L, produced by Dai-Nippon Toryo Co., Ltd.) in a ball mill, calcinating the mixture at 1,000° C. and molding the mixture, since the sintering temperature of the bonded laminate becomes not lower than 1,200° C., it becomes a complete solid solution. The temperature characteristic of this bonded laminate therefore is that the temperature coefficient has a peak of an intermediate value of of the respective layers, and it is impossible to obtain a flat Np temperature characteristic coefficient like a laminated composite piezoelectric element according to the present invention.

In the above-described manner, a multilayer piezoelectric composite according to the present invention is produced. What is important in producing it is that it is necessary to sinter a bonded laminate at a temperature which hardly allows a solid solution to be formed between the layers having different compositions and yet makes each layer sufficiently dense in order to prevent the unification of the compositions (namely, the formation of a solid solution between layers) by causing the diffusion of the compositions between the layers having different compositions. This is because if a solid solution is formed between layers, it is impossible to obtain the target piezoelectric ceramic having a low temperature dependency in a temperature range (ordinarily 0° to 100° C.).

It is possible to obtain a piezoelectric element having a further lower temperature tendency without changing the total thickness of the multilayer piezoelectric composite by deliberately selecting the compositions of piezoelectric ceramics to be laminated and appropriately selecting the thickness of each of the layers having the respective compositions in the present invention.

It is also possible to add an appropriate amount of relaxor such as a rare earth element, oxide of Cr, Mn, Fe, Nb or the like, perovskite of $Ba(Mg_{1/3}Nb_{2/3})O3$, barium titanate or the like, $Pb(Mg_{1/3}Nb_{2/3})O3$, $Pb(Ni_{1/3}Nb_{2/3})O3$, $Pb(Co_{1/3}Nb_{2/3})O3$ and $Pb(Fe_{1/2}Nb_{1/2})O3$ to a PZT powder.

The order of lamination of layers of different compositions is not specified so long as a bonded laminate produced does not cause a strain and diffusion between layers at the time of sintering.

The present invention is not restricted to a multilayer piezoelectric composite and a process for producing the same in which the absolute value of the temperature coefficient of a frequency constant of the bonded laminate is smaller than the absolute value of the temperature coefficient of a frequency constant of any of the layers but includes a multilayer piezoelectric composite and a process for producing the same in which the absolute value of the temperature coefficient of a frequency constant of the bonded laminate is smaller than the absolute value of the temperature coefficient of a frequency constant of one of the layers.

For example, a multilayer piezoelectric composite having a temperature coefficient of +20 which is produced by laminating an appropriate number of green sheets having a temperature coefficient of +100 and an appropriate number of green sheets having a temperature coefficient of −10 and a process for producing the same are included in the scope of the present invention.

The present invention will be explained in more detail with reference to the following examples but it will be understood that the present invention is not restricted thereto and various modifications may be made thereto within the true spirit and scope of the invention.

A. Production of green sheet of piezoelectric ceramic

Green sheets of piezoelectric ceramics having various compositions were produced by a tape casting process by using equimolar quantities of zirconium titanate $(Zr_xTi_{1-x})O_2$ powder having an average particle diameter of 0.1 μm and lead oxide powder (PbO) as starting materials.

(Process Example 1)

A green sheet of $Pb(Zr_{0.52}Ti_{0.43})O_3$ was produced.

The starting materials were weighed so as to have the above composition and mixed together with acetone by a wet process in a ball mill containing zirconia balls about 10 hours. Thereafter, the mixture was calcinated at a temperature of 700° C. for 1 hour.

The thus-obtained calcinated PZT powder was pulverized in a ball mill, a planetary mill or the like into a powder having an average particle diameter of 0.2 μm. To 100 g of the powder obtained were added 30 g of a solvent and 7 g of a binder and the mixture was thoroughly mixed in a ball mill. The resulting mixture was defoamed under a reduced pressure to obtain a slurry.

The compositions of the solvent and the binder used in this example are shown in the following. "Part" means "part by weight".

| <Solvent> | |
|---|---|
| Butanol | 100 parts |
| Toluene | 100 parts |
| Methyl cellosolve | 100 parts |
| Methyl ethyl ketone | 100 parts |
| Siloxane | 100 parts |
| Dioctyl phthalate | 50 parts |
| Gafac RE-610 | 5 parts |
| <Binder> | |
| Polyvinyl butyral (Denka 4000-1; reference code: produced by Electro Chemical Industry Co., Ltd.) | 20 parts |
| The above-described solvent | 80 parts |

The slurry obtained in this way was molded by a tape casting process while using a doctor blade and the molded product was naturally dried for 24 hours to obtain a green sheet of a piezoelectric ceramic powder of 100 μm thick.

(Process Example 2)

A green sheet of $Pb(Zr_{0.53}Ti_{0.47})O_3$ was produced.

A green sheet of a piezoelectric ceramic powder of 100 μm thick was produced in the same way as in Process Example 1 except for using equimolar quantities of zirconium titanate $(Zr_{0.53}Ti_{0.47})O_2$ powder and lead oxide powder (PbO) as the starting materials so as to have the above-described composition.

(Process Example 3)

A green sheet of $Pb(Zr_{0.54}Ti_{0.46})O_3$ was produced.

A green sheet of a piezoelectric ceramic powder of 100 μm thick was produced in the same way as in Process Example 1 except for using equimolar quantities of zirconium titanate $(Zr_{0.54}Ti_{0.46})O_2$ powder and lead oxide powder (PbO) as the starting materials so as to have the above-described composition.

(Process Example 4)

A green sheet of $Pb(Zr_{0.55}Ti_{0.45})O_3$ was produced.

A green sheet of a piezoelectric ceramic powder of 100 μm thick was produced in the same way as in Process Example 1 except for using equimolar quantities of zirconium titanate $(Zr_{0.55}Ti_{0.45})O_2$ powder and lead oxide powder (PbO) as the starting materials so as to have the above-described composition.

B. Production of multilayer piezoelectric composite

EXAMPLE 1

The green sheets of $Pb(Zr_{0.52}Ti_{0.48})O_3$ obtained in Process Example 1 and the green sheets of $Pb(Zr_{0.54}Ti_{0.46})O_3$ obtained in Process Example 3 were laminated in a ratio of numbers of sheets of 1:1 in the manner shown by the section in FIG. 2. The laminate was subjected to thermocompression bonding at a temperature of 80° C. and an applied pressure of 300 kg/cm², and the bonded laminate was sintered at 1,000° C. for 2 hours to obtain a sample PZT52-54 (1:1) of a multilayer piezoelectric composite according to the present invention.

EXAMPLE 2

A sample PZT52–55 (1:2) of a multilayer piezoelectric composite according to the present invention was obtained in the same way as in Example 1 except for laminating the green sheets of $Pb(Zr_{0.52}Ti_{0.48})O_3$ obtained in Process Example 1 and the green sheets of $Pb(Zr_{0.55}Ti_{0.45})O_3$ obtained in Process Example 4 were laminated in a ratio of numbers of sheets of 1:2 in the manner shown by the section in FIG. 3.

EXAMPLE 3

A sample PZT52-55 (1:3) of a multilayer piezoelectric composite according to the present invention was obtained in the same way as in Example 1 except for laminating the green sheets of $Pb(Zr_{0.52}Ti_{0.48})O_3$ obtained in Process Example 1 and the green sheets of $Pb(Zr_{0.52}Ti_{0.48})O_3$ obtained in Process Example 4 were laminated in a ratio of numbers of sheets of 1:3 in the manner shown by the section in FIG. 4.

EXAMPLE 4

A sample PZT52-55 (1:4) of a multilayer piezoelectric composite according to the present invention was obtained in the same way as in Example 1 except for laminating the green sheets of $Pb(Zr_{0.52}Ti_{0.48})O_3$ obtained in Process Example 1 and the green sheets of $Pb(Zr_{0.55}Ti_{0.45})O_3$ obtained in Process Example 4 were laminated in a ratio of numbers of sheets of 1:4 in the manner shown by the section in FIG. 5.

C. Measurement of piezoelectric temperature characteristics

Silver was sputtered on both side surfaces of each of the samples produced in Examples 1 to 4 to form electrodes. The temperature characteristic of a frequency constant Np, which is a typical index of a piezoelectric characteristic, of each sample was measured by a resonance—anti-resonance method by using an LF impedance analyzer (Model HP4192A, produced by Hewlett Packard).

Figure 6:
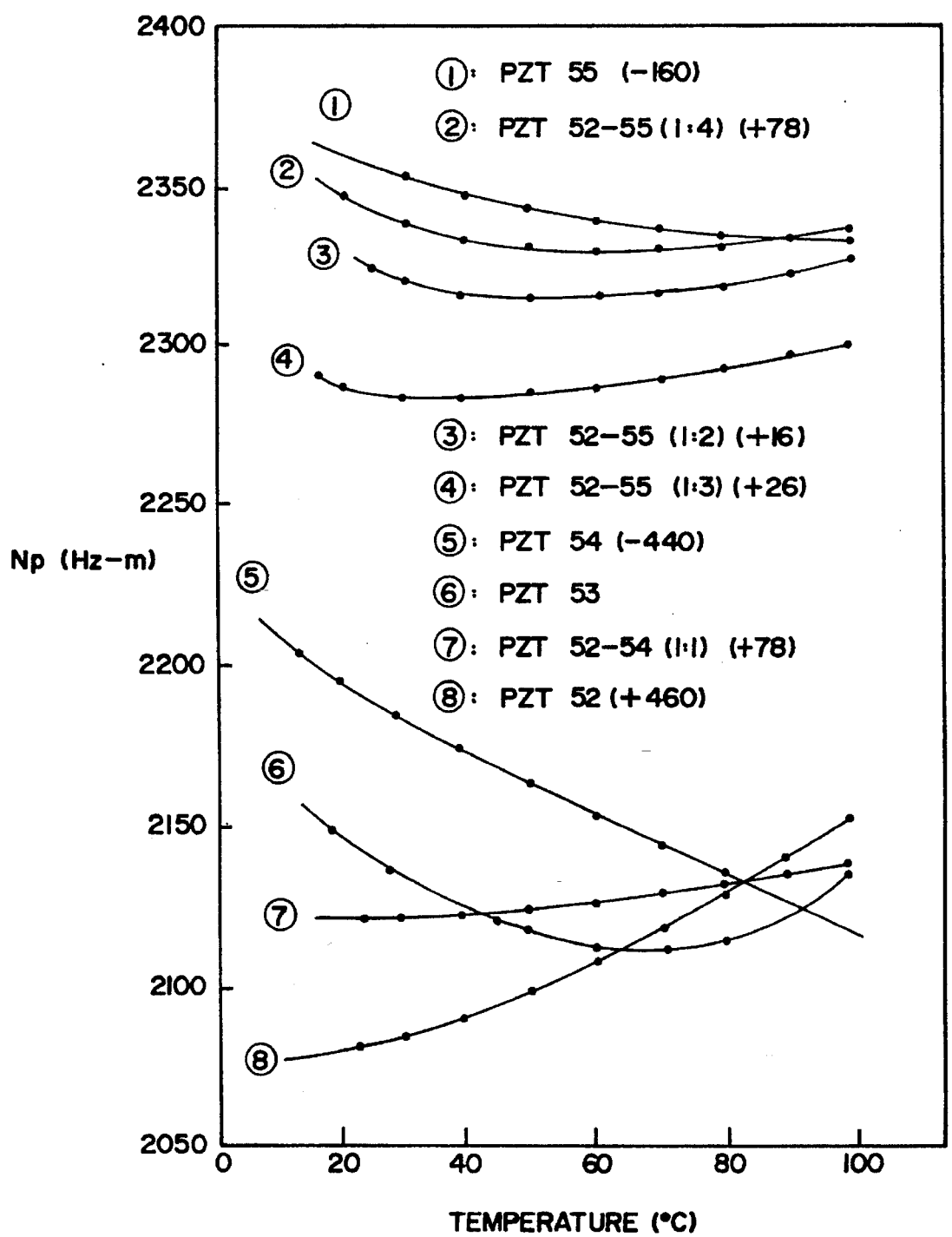
FIG. 6 is a graph showing the piezoelectric temperature characteristics of the embodiments of a multilayer piezoelectric composite shown in FIGS. 2 to 5.

FIG. 6 is a graph showing the measured temperature characteristic of a frequency constant Np of each sample wherein the ordinate represents Np and the abscissa represents a temperature (°C.).

Figure 7:
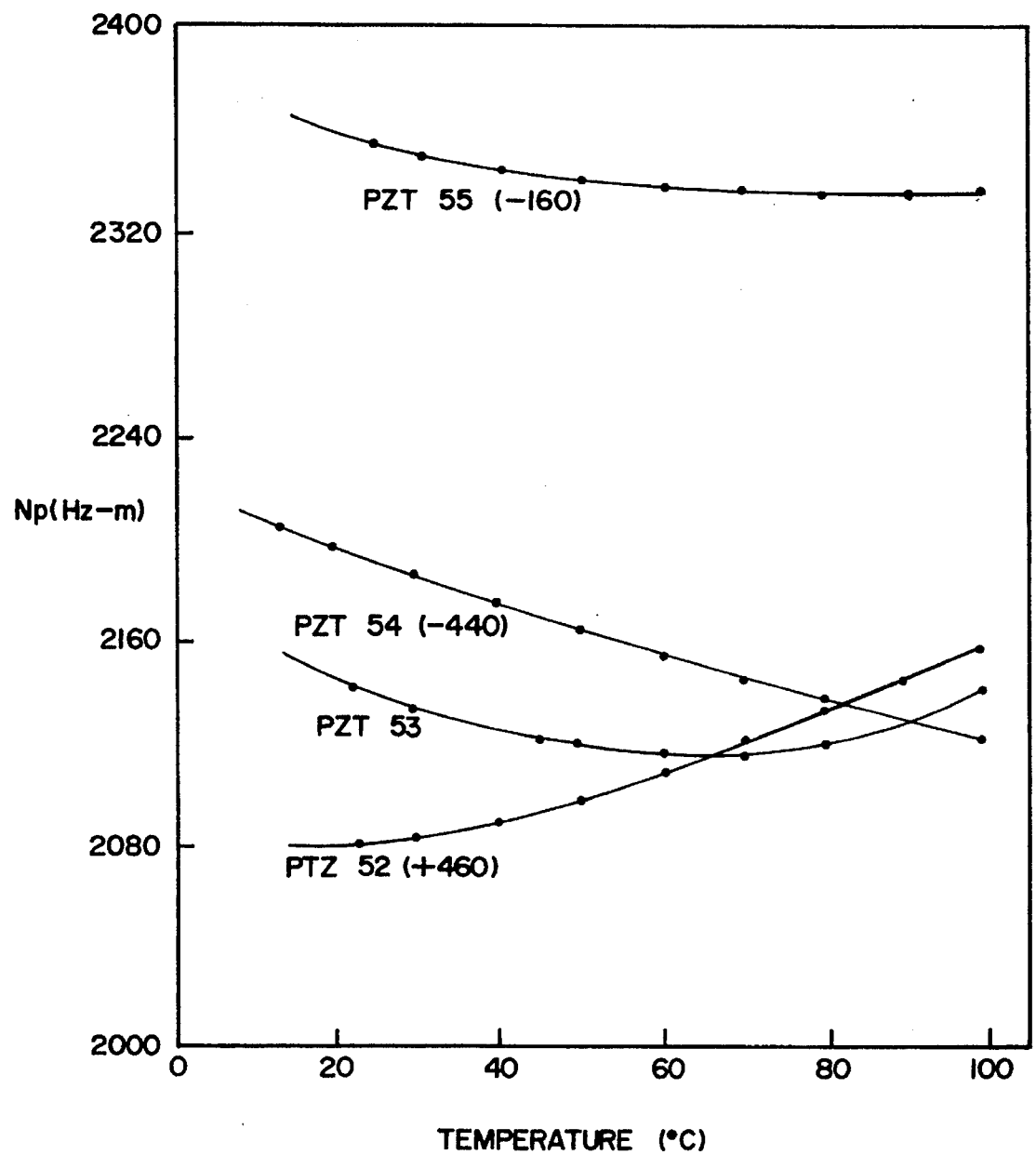
FIG. 7 shows the piezoelectric temperature characteristics of various single-layer piezoelectric elements.

The piezoelectric temperature characteristics of the conventional single-layer piezoelectric elements shown in FIG. 7 and explained under the subtitle of Description of the Prior Art in this specification are also shown in FIG. 6 for the sake of comparison.

The temperature coefficient of each sample at 30° C. calculated on the basis of FIGS. 6 and 7 are shown in the following table.

| Sample | Temperature coefficient ($10^{-6}/°C.$) |
| --- | --- |
| PZT 52 | +460 |
| PZT 53 | −345, +348 |
| PZT 54 | −440 |
| PZT 55 | −160 |
| PZT52-54 (1:1) | +78 |
| PZT52-55 (1:2) | +16 |
| PZT52-55 (1:3) | +26 |
| PZT52-55 (1:4) | −65 |

It is observed from FIG. 6 and the above table that while the conventional single-layer piezoelectric elements have a high temperature dependence as represented by a temperature coefficient as large as a three-figure ppm, any of the multilayer piezoelectric composites according to the present invention obtained in Examples 1 to 4 has a very low temperature dependence as represented by the temperature coefficient as small as a two-figure ppm in a practical temperature range.

As described above, since a multilayer piezielectric composite according to the present invention has a piezoelectric characteristic having a low temperature dependence, it is suitable for uses as a whole in which such a characteristic is required, especially, as an electronic circuit element such as a resonance filter and a wave filter.

What is claimed is:

1. A process of producing a multilayer piezoelectric composite comprising the steps of:

(a) preparing green sheets of a lead zirconate titanate piezoelectric ceramic by molding lead zirconate titanate having a particle diameter of not more than 0.5 μm which is obtained by heat treating equimolar quantities of crystalline zirconium titanate represented by the general formula $Zr_xTi_{1-x}O_z$ and having a particle diameter of not more than 0.3 μm and lead oxide at a temperature of not more than 800° C. and pulverizing the resultant product;

(b) preparing a bonded laminate by laminating and bonding together under pressure green sheets of plural kinds of lead zirconate titanate piezoelectric ceramics, at least one layer of which has a temperature coefficient of frequency constant whose polarity is opposite to that of the other layers; and (c) sintering the bonded laminate at a temperature of not higher than 1100° C. so that substantially no interdiffusion takes place between the layers;

thereby providing a multilayer piezoelectric composite having an absolute value for the temperature coefficient of frequency constant which is smaller than the absolute value of the temperature coefficient of frequency constant of any one of the layers.

* * * * *